(12) United States Patent
Dietz et al.

(10) Patent No.: US 11,480,607 B2
(45) Date of Patent: Oct. 25, 2022

(54) DETERMINING THE REMAINING USABILITY OF A SEMICONDUCTOR MODULE IN NORMAL USE

(71) Applicant: SIEMENS AKTIENGESELLSCHAFT, Munich (DE)

(72) Inventors: Gunnar Dietz, Nuremberg (DE); Markus Mauersberger, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/426,510

(22) PCT Filed: Dec. 17, 2019

(86) PCT No.: PCT/EP2019/085666
§ 371 (c)(1),
(2) Date: Jul. 28, 2021

(87) PCT Pub. No.: WO2020/156733
PCT Pub. Date: Aug. 6, 2020

(65) Prior Publication Data
US 2022/0043050 A1    Feb. 10, 2022

(30) Foreign Application Priority Data

Jan. 30, 2019   (EP) .................................. 19154453

(51) Int. Cl.
*G01R 31/28*   (2006.01)
*G01R 31/26*   (2020.01)
*H03K 17/08*   (2006.01)

(52) U.S. Cl.
CPC ..... *G01R 31/2817* (2013.01); *G01R 31/2619* (2013.01); *G01R 31/2642* (2013.01); *H03K 17/08* (2013.01); *H03K 2017/0806* (2013.01)

(58) Field of Classification Search
CPC ............ G01R 31/2619; G01R 31/2642; G01R 31/2817; G01R 31/42; G01R 31/2628;
(Continued)

(56) References Cited

U.S. PATENT DOCUMENTS 8,325,452 B2 * 12/2012 Ichikawa ........... H03K 17/0822
361/93.8
9,236,826 B2 *  1/2016 Djonga ................. G01K 7/427
(Continued)

FOREIGN PATENT DOCUMENTS

EP       3 054 306 A1    8/2016
EP       3 203 250 A1    8/2017
(Continued)

OTHER PUBLICATIONS

PCT International Search Report and Written Opinion of International Searching Authority dated Feb. 4, 2020 corresponding to PCT International Application No. PCT/EP2019/085666 filed Dec. 17, 2019.

*Primary Examiner* — Vinh P Nguyen
(74) *Attorney, Agent, or Firm* — Henry M.Feiereisen LLC

(57) ABSTRACT

A method for determining the remaining usability of a semiconductor module in normal use. The semiconductor module is thermally coupled to a cooling device. A predefined electrical load is applied to the semiconductor module while predefined cooling is effected by the cooling device. A temperature of a semiconductor element of the semiconductor module is sensed at least for the predefined electrical load on the semiconductor module. The sensed temperature is compared with a comparison temperature in a first comparison. The comparison temperature is assigned to the predefined electrical load with the predefined cooling, and prediction data for the remaining usability of the semi-
(Continued)

conductor module in normal use up to a usability end are determined at least in accordance with the first comparison.

20 Claims, 2 Drawing Sheets

(58) Field of Classification Search
CPC .......... H02M 1/32; H02M 1/327; H02M 1/08; H02M 1/0054; H02M 1/0095; H02M 7/487; H02M 7/537; H02M 7/5387; H02M 1/12; H02M 3/1555; H02M 5/06; H02M 7/217; H02M 7/483; H02M 7/4835; H02M 7/757; H02M 7/797; H03K 17/08; H03K 17/18; H03K 2017/0806; H03K 17/165; H03K 17/168; H02P 29/0088; H02P 21/0035; H02P 6/001; H02P 29/68; H02P 21/06; H02P 5/56; H02P 2101/10; H02P 2103/10; H02P 23/08; H02P 27/08; H02P 9/007; H02P 9/102; H02P 9/305; G01K 2217/00; G01K 7/01; G01K 7/427; H01L 2224/32225; H01L 2224/33181; H01L 2924/12032; H01L 2924/1305; H01L 2924/13055; H01L 2924/13091; H02J 3/1807; H02J 1/082; H05B 1/0244

See application file for complete search history.

(56) References Cited

U.S. PATENT DOCUMENTS

| | | | | |
|---|---|---|---|---|
| 9,869,722 | B1* | 1/2018 | Morris | G01R 31/2849 |
| 10,175,275 | B2* | 1/2019 | Tsurumaru | G01K 7/42 |
| 10,720,852 | B1* | 7/2020 | Soles | H05K 7/20872 |
| 10,886,871 | B2* | 1/2021 | Ewanchuk | G01R 31/2608 |
| 11,016,138 | B2* | 5/2021 | Kimura | G01R 31/26 |
| 2004/0124808 | A1* | 7/2004 | Hirono | H02P 27/08 |
| | | | | 318/806 |
| 2009/0046405 | A1 | 2/2009 | Ichikawa | |
| 2011/0015881 | A1 | 1/2011 | Chen et al. | |
| 2018/0017612 | A1 | 1/2018 | Burton-Ccoca et al. | |
| 2019/0285689 | A1 | 9/2019 | Degrenne et al. | |

FOREIGN PATENT DOCUMENTS

| | | |
|---|---|---|
| JP | 2011196703 A | 10/2011 |
| JP | 2015056415 A | 3/2015 |
| JP | 2016184506 A | 10/2016 |

* cited by examiner

DETERMINING THE REMAINING USABILITY OF A SEMICONDUCTOR MODULE IN NORMAL USE

CROSS-REFERENCES TO RELATED APPLICATIONS

This application is the U.S. National Stage of International Application No. PCT/EP2019/085666, filed Dec. 17, 2019, which designated the United States and has been published as International Publication No, WO 20201156733 A1 and which claims the priority of European Patent Application, Serial No. 19154453.5, filed Jan. 30, 2019, pursuant to 35 U.S.C. 119a-d.

BACKGROUND OF THE INVENTION

The invention relates to methods for determining the remaining usability of a semiconductor module in normal use which is thermally coupled to a cooling device. The invention further relates to a method for operating an energy converter connected to an electric machine, which energy converter electrically couples the electric machine to a d.c. link, for which purpose at least one semiconductor module thermally coupled to a cooling device interacts with at least one energy store electrically coupled to the semiconductor module and is operated in a predefinable switching mode for electrically coupling the d.c. link to the electric machine. The invention further relates to control units for controlling at least one semiconductor module thermally coupled to a cooling device. Finally, the invention also relates to an energy converter for connection to an electric machine, having at least one semiconductor module, at least one cooling device thermally coupled to the at least one semiconductor module, at least one energy store electrically coupled to the at least one semiconductor module, connection contacts for connecting the electric machine, a d.c. link terminal for connecting the energy converter to a d.c. link, and a control unit electrically coupled to the at least one semiconductor module for controlling the at least one semiconductor module in a predefinable switching mode, in order to electrically couple the d.c. link and the electric machine to one another.

Methods, control units and energy converters of the generic type are extensively known in principle in the prior art, such that separate evidence in printed form is not required for this. They relate in particular to the use of semiconductor modules which are used in a wide range of applications in the prior art to convert electrical energy in a variety of ways. The conversion of the electrical energy is generally accomplished by means of an energy converter, which for example can be embodied as a power inverter.

The power inverter is a form of energy converter which in terms of energy couples a d.c. link to an a.c. voltage network, so that electrical energy can be exchanged between the d.c. link and the a.c. voltage network. For this purpose provision is generally made for the energy converter to have at least one switching element which interacts with electrical energy stores. The at least one switching element is generally formed from a semiconductor module which may comprise one or more semiconductor switching elements.

On the a.c. voltage side the a.c. voltage network can be formed for example by an electric machine, in particular a multiphase electric machine. By controlling the at least one switching element by means of a control unit in switching mode the desired conversion function of the power inverter or of the energy converter can be achieved, such that the desired drive function can be achieved with the electric machine.

For this purpose the switching elements are usually operated at a predefined clock rate which is considerably greater than a frequency of at least one phase change voltage of the a.c. voltage network. By means of particular control methods, such as pulse width modulation (PWM) or the like, the desired energy coupling can then be produced. For this purpose the control unit provides specific switching signals for the at least one switching element or each of the switching elements, such that the at least one switching element or the switching elements can be operated in the desired manner in switching mode.

It has been shown that semiconductor modules, in particular according to the type of power modules, are subject to aging, which among other things is a function of a rise in temperature of a semiconductor element, which can be caused for example by a changing electrical load. After a particular number of temperature cycles in respect of the load changes, an end of usability for the usability of the semiconductor module in normal use is reached, and this can result in a failure of the semiconductor module. One of the reasons for this may be a breakdown of various structural and connecting layers and an associated poorer thermal link between the semiconductor element and the cooling device. The failure of a semiconductor module, in particular of an energy converter having at least one semiconductor module, proves to be disruptive and in some cases may even lead to dangerous states. It is hence desired to have information about the remaining usability of the semiconductor module in normal use available, so that on the one hand maintenance can be carried out well before a failure of the semiconductor module and on the other hand the maintenance does not need to be undertaken until the end of usability is in the foreseeable future.

For this purpose it has hitherto been normal to determine a temperature of the semiconductor element using a thermal model. This is based on a temperature at the cooling device sensed by means of a temperature sensor, with arithmetical approximations being performed and the actual temperature of the semiconductor element being inferred. Based on the temperature of the semiconductor element calculated in this manner a respective rise in temperature of the semiconductor element can be estimated and enumerated. Using empirical trials by means of load change tests in respect of the at least one semiconductor module the number of temperature cycles until the semiconductor module fails can be determined. This load change stability is determined for a predefined, comparatively large rise in temperature, for example greater than 70K.

However, in normal operation of the semiconductor module only smaller rises in temperature generally occur, for example in a range between approximately 10K and approximately 35K. Larger rises in temperature occur only in isolated cases.

The aforementioned thermal model for determining the remaining usability proves to be disadvantageous to the extent that a current loss power is taken into account as an operand and is arithmetically determined using a few stored points. Furthermore, this model does not take into account that a thermal resistance between the semiconductor element and the cooling surface may change with progressive use of the semiconductor module, in particular may increase. These points, the measurement of the load change stability in the event of a rise in temperature of more than 70K in conjunction with a batch variation of the semiconductor modules, the restricted accuracy of the determination of the current losses and the change in the thermal resistance as a function of normal use result in a very inaccurate determination of the end of usability or of the remaining usability. The maintenance is hence generally carried out well before the end of usability, although there may in fact still be some while before the end of usability. This is time-consuming and expensive.

EP 3 054 306 A1 further discloses a method for determining the aging of power semiconductor modules as well as a device and a switching arrangement. JP 2011-196703 A furthermore discloses a power cycle service life estimation for a power semiconductor module. In addition, EP 3 203 250 A1 discloses a method and a device for estimating the level of damage or a life expectancy of a power semiconductor module. Finally, US 2009/0046405 A1 discloses a semiconductor device.

The object of the invention is to determine more accurately the end of usability or the remaining usability of the semiconductor module in normal use.

SUMMARY OF THE INVENTION

As a solution the invention proposes methods, control units and an energy converter in accordance with the independent claims.

Advantageous developments emerge on the basis of features of the dependent claims.

In respect of a generic method it is proposed in accordance with a first aspect that a predefined electrical load is applied to the semiconductor module while predefined cooling is effected by the cooling device, a temperature of the semiconductor element of the semiconductor module is sensed at least for the predefined electrical load of the semiconductor module, the sensed temperature is compared with a comparison temperature in a first comparison, wherein the comparison temperature is assigned to the predefined electrical load during the predefined cooling, and prediction data for the remaining usability of the semiconductor module in normal use up to the end of usability is determined at least as a function of the first comparison.

In respect of a generic method it is proposed in accordance with a second aspect that a predefined electrical load is applied to the semiconductor module while predefined cooling is effected by the cooling device, a thermal resistance between a semiconductor element of the semiconductor module and the cooling device is determined, the determined thermal resistance is compared with a thermal reference resistance in a second comparison and prediction data for the remaining usability of the semiconductor module in normal use up to the end of usability is determined at least as a function of the second comparison.

In respect of a generic method for operating an energy converter it is proposed in particular that the remaining usability of the at least one semiconductor module in normal use is determined in accordance with the invention.

In respect of a generic control unit it is in particular proposed as regards the first aspect that the control unit is embodied to apply a predefined electrical load to the semiconductor module while predefined cooling is effected by the cooling device, to sense a temperature of the semiconductor element of the semiconductor module at least for the predefined electrical load of the semiconductor module, to compare the sensed temperature with a comparison temperature in a first comparison, wherein the comparison temperature is assigned to the predefined electrical load while the predefined cooling is effected, and to determine prediction data for the remaining usability of the semiconductor module in normal use up to the end of usability at least as a function of the first comparison.

In respect of a generic control unit it is in particular proposed as regards the second aspect that the control unit is embodied to apply a predefined electrical load to the semiconductor module while predefined cooling is effected by the cooling device, to determine a thermal resistance between a semiconductor element of the semiconductor module and the cooling device, to compare the determined thermal resistance with a thermal reference resistance in a second comparison and to determine prediction data for the remaining usability of the semiconductor module in normal use up to an end of usability at least as a function of the second comparison.

In respect of a generic energy converter it is in particular proposed that the control unit is embodied in accordance with the invention.

DETAILED DESCRIPTION OF PREFERRED EMBODIMENTS

The invention is based on the idea that by sensing the temperature of the semiconductor element virtually immediately or directly in accordance with the first aspect or by determining the thermal resistance in accordance with the second aspect the prediction data can be determined considerably more accurately than hitherto. In this case specific properties of the semiconductor module or of the semiconductor element thereof can be used to sense the actual temperature of the semiconductor element. Thus for example in the case of an IGBT the temperature sensing can be achieved by sensing the threshold voltage of the IGBT by means of a voltage sensor. The threshold voltage is normally a function of the temperature of the semiconductor element or of the semiconductor chip of the IGBT. In addition, it can of course also be provided that the semiconductor element comprises an integrated PN junction for example, which can serve as a temperature sensor. In this connection reference is made inter alia to the publication "Application issues of an online temperature estimation method in a high-power 4.5 kV IGBT module based on the gate-emitter threshold voltage" by Höher, M. et al., European Conference on Power Electronics and Applications, EPE 2016, ECCE Europe, Karlsruhe, Germany, September 2016.

The invention further uses the knowledge that, in particular in respect of the first aspect in the case of a predefined electrical load and a predefined cooling by the cooling device, an increase in the sensed temperature or of a sensed rise in temperature can be a measure for aging and thus for the remaining usability of the semiconductor module in normal use. Based on this knowledge, the comparison temperature which is used for the performance of the first comparison can further be empirically determined. This can take place for example in the form of laboratory trials, in particular using statistical methods and/or the like. As a function of the comparison the prediction data for the remaining usability of the semiconductor module in normal use up to the end of usability can then be determined. The prediction data can for this purpose for example be determined as a function of a difference between the sensed temperature and the comparison temperature. In accordance with the first aspect the sensed temperature is therefore used for the determination of the prediction data.

For the second aspect use is made of the knowledge that the thermal resistance between the semiconductor element and the cooling device can be used to determine the prediction data. In this case use is made of the knowledge that the thermal resistance may likewise be a function of the aging of the semiconductor module, because the thermal resistance may rise as the aging of the semiconductor module increases. This can be used to determine the prediction data in the context of a second comparison. For this purpose a thermal reference resistance is determined, which is made available for the second comparison. The thermal reference resistance can likewise be determined by laboratory trials, in particular using statistical methods and/or the like. Thus it is also possible, if the thermal resistance between the semiconductor element and the cooling device has been determined, likewise to determine prediction data using the second comparison.

Both the aspects can of course also in principle be used in combination with one another, in order to increase the accuracy or to be able to better take into account specific applications of the semiconductor modules.

A semiconductor module within the meaning of this disclosure is in particular directed at a mechanical construction of the semiconductor switching element, in which a semiconductor element, which can for example be formed by a semiconductor chip or the like, is thermally coupled to a cooling surface which in turn can be coupled to a cooling device, to be able to dissipate heat arising during the normal operation of the switching element. For this purpose the semiconductor element is generally permanently connected to the cooling surface by means of mechanical connection methods and/or mechanical connection means, such that as favorable a thermal transfer resistance as possible can be achieved. The semiconductor module can thus have at least one semiconductor element. However, if need be the semiconductor module can also have other semiconductor elements, which then can either have separate cooling surfaces or can be at least partially jointly connected to a single cooling surface. The semiconductor module frequently comprises a housing which provides the cooling surface. At the same time a, for example, hermetic seal against an external atmosphere can be achieved with the housing, such that the semiconductor element or the semiconductor elements can be protected against external mechanical and atmospheric effects.

The energy converter can comprise at least one single semiconductor module as a switching element. However, multiple semiconductor modules can also be provided if need be, to be able to implement desired energy conversion functionalities. To be able to implement the energy converter the energy converter generally also comprises an electrical energy store or is at least electrically coupled to such a store, for example one or more capacitors, one or more electric coils and/or the like. Combination circuits thereof can of course also be provided. The energy conversion function of the energy converter is implemented by means of the semiconductor modules in interaction with the at least one energy store.

The at least one semiconductor module, which forms at least one switching element of the energy converter, has in each case at least one control terminal for implementation of the desired switching function, to which the switching signal provided by the control unit can be applied, such that the desired switching function of the semiconductor module can be implemented. The switching signal can be a binary switching signal which can assume at least two state values to enable the desired switching functions of the semiconductor module to be provided. For example, the switching signal can be formed by a pulse sequence, which is applied to the control terminal. This is primarily expedient in the case of semiconductor modules which comprise thyristors and GTOs. In addition, it can be provided in the case of transistors that the switching signal is a square-wave signal, wherein a respective switching state of the switching element or of the semiconductor module can be assigned to one of the potentials of the square-wave signal. This type of signal is for example expedient for transistors, in particular for bipolar transistors, field effect transistors or the like.

The switching element within the meaning of this disclosure, which is generally embodied as a semiconductor switching element, is in this case preferably a controllable electronic switching element, for example a controllable electronic semiconductor switch such as, for example, a transistor which is operated in switching mode, a thyristor, combination circuits thereof, preferably with parallel-switched inverse diodes, a Gate Turn Off thyristor (GTO), an Insulated Gate Bipolar Transistor (IGBT), combinations thereof or the like. However, the switching element can also be formed in principle by a field effect transistor, in particular a Metal Oxide Semiconductor Field Effect Transistor (MOSFET).

For the purpose of energy conversion the at least one semiconductor module is generally operated in a switching mode. In respect of a semiconductor switch using a transistor, the switching mode means that a very small electrical resistance is provided in an active switching state between the terminals of the transistor forming a switching path, such that a high flow of current is possible in the case of a small residual voltage. By contrast, in an inactive switching state the switching path of the transistor is high-resistance, i.e. it provides a high electrical resistance, such that even in the case of a high electrical voltage present on the switching path substantially no or only a very low, in particular negligible, flow of current is present. This differs from a linear mode in the case of transistors, which however is generally not used in energy converters of the generic type.

The control unit provides the functionality for generating the switching signals. Further functions, in particular in respect of the energy converter, can also be implemented by the control unit, for example monitoring functions, safety functions and/or the like. For this purpose the control unit may comprise a hardware circuit and/or a program-controlled computing unit or the like. The control unit can of course be embodied as a separate subassembly. The control unit can however also be comprised at least in part of a higher-level controller of the energy converter or the drive device which comprises the energy converter.

The electric machine can be a d.c. voltage machine or an a.c. voltage machine. As an a.c. voltage machine the electric machine can be a single-phase or a multi-phase a.c. voltage machine. The electric machine can for example be a synchronous machine, an asynchronous machine or the like. If the electric machine is a synchronous machine, it can for example be embodied as a permanent-field synchronous machine. It can however also be embodied as a separately excited synchronous machine or the like. Combinations thereof can of course also be considered, in order for example to enable particular drive functions to be implemented which make it desirable to influence the magnetic flux.

The clock rate substantially corresponds to a frequency with which the switching signals are provided for the at least one semiconductor module by the control unit. In this case it can be provided that a pulse for controlling a single switching element synchronized with the clock rate provides an ON period and an OFF period for the switching element.

The at least one semiconductor module is generally embodied as a power semiconductor module, sometimes also called a power module, for which reason cooling by the cooling device is desired in normal operation. Depending on the electrical load on the semiconductor module in normal operation, heat is generated in the semiconductor module, and is dissipated by means of the cooling device, in order to prevent a thermal overload of the semiconductor module. One reason why the heat arises in the semiconductor module in normal operation is that an electrical current flows and thus on-state power losses arise. Another reason why the heat arises is that switching losses arise during the change-over between an active switching state and an inactive switching state.

The prediction data can be used to provide a corresponding message to inform a user. The message can tell the user the probable useful life or the remaining usability for the semiconductor module in normal use. In addition, the message can serve to plan maintenance, so that the semiconductor module can be used as extensively as possible up to the end of usability and corresponding maintenance can be carried out well before a failure of the semiconductor module. This means that costs for maintenance and the operation of the semiconductor module as well as of devices that use the semiconductor module, for example the energy converter or the like, can be reduced.

The prediction data is preferably formed by an electrical signal, for example. The prediction data can comprise digital data, for example. However, it can also in principle comprise analog data. The prediction data can be determined or ascertained by an evaluation unit of the control unit. For this purpose the evaluation unit can for example comprise an electronic circuit, a program-controlled computing unit, combinations thereof or the like. The evaluation unit can be embodied as a separate subassembly of the control unit. However, it can also in principle be comprised of a higher-level control unit which for example controls the device which comprises the semiconductor module.

To determine the prediction data, the comparison result of at least the first comparison and/or the second comparison is made available for the control unit, and here in particular for the evaluation unit. For this purpose a comparison signal can be evaluated by the evaluation unit during the performance of a respective one of the comparisons, in order to determine the prediction data. The determination of the prediction data can additionally take place using statistical methods. For this purpose average values, variances and/or the like can be determined. Further reference data can furthermore be used for this, which can for example be stored in a storage unit of the control unit, in particular of the evaluation unit. In addition, this reference data can of course also be provided at least in part by an external storage device via a communication link between this storage device and the control unit or the evaluation unit. This means it is possible to provide the reference data centrally, such that it can easily be maintained or updated. In addition, the reference data can then also be provided for a plurality of different control units or evaluation units. The reference data can for example be determined using one or more reference semiconductor modules. These can for example be determined in the context of laboratory examinations. The different possibilities for determining the prediction data can of course also be combined with one another.

The message corresponding to the prediction data can for example be an electrical, optical, hydraulic, pneumatic or else haptic signal. The message can also be a combination of one or more of the aforementioned signals. The message can be determined from the prediction data, by passing the prediction data to a processing unit, for example a signaling device or the like, which then as a function thereof determines the corresponding message, such that as a function of the corresponding message a display of the assigned information that is recognizable for a user can be provided. In particular the corresponding message can provide a predicted number of temperature changes of the semiconductor element and/or a predicted period for the remaining usability in normal use. For example, the thermal reference resistance can be determined at the start of the normal usability of the semiconductor module. If the determined thermal resistance reaches a value which exceeds the thermal reference resistance by for example approximately 20%, the consequence can be that the end of usability is immediately imminent. The prediction data is determined correspondingly.

The processing unit or the signaling device can be comprised by the control unit. However, it can also be embodied as a separate processing unit or as a separate signaling device which has a communication link with the control unit. Combinations thereof can of course also be provided. The processing unit or the signaling device process the prediction data such that the desired corresponding message or presentation of the information can be achieved. This may depend on the signaling device, and in particular on which medium the signaling device uses for the presentation of the information. Thus the signaling device can for example be embodied for an optical, acoustic and/or haptic output of the information, wherein the prediction data is suitably processed, so that the desired output of information can be achieved. In this case it can be provided that the type of output of the information can be set by the user, for example if the signaling device provides different output options. For this purpose corresponding input means can be provided which permit the user to make a corresponding setting.

The control unit can be embodied as a separate subassembly which can comprise a separate housing. However, the control unit is preferably part of a higher-level controller of a device which uses the semiconductor module, for example of the energy converter or the like.

To determine the prediction data the predefined electrical load is applied to the semiconductor module while predefined cooling is effected by the cooling device. Thanks to the predefined electrical load a corresponding predefined operating state can be achieved, such that a corresponding loss power of the semiconductor module can be determined. The loss power can be assigned a thermal power which is to be correspondingly dissipated by the cooling device in order to ensure the normal operation of the semiconductor module. For this purpose it can be provided that the predefined electrical load comprises predefined switching patterns with a predefined voltage stress and/or current stress. This means defined basic conditions for determining the temperature or the thermal resistance can be achieved, to enable the respective corresponding comparison to be carried out normally.

Normal usability comprises in particular the normal use of the semiconductor module to carry out the electrical control function, for example as a switching element in the energy converter, as a switching element in power distribution and/or the like. In this case normal usability refers to the semiconductor module being operated during the normal operation of the device which comprises the semiconductor module, in a safe operating area (SOA). This specification generally involves manufacturer's specifications. The end of usability for normal usability of the semiconductor module is correspondingly preferably characterized in that under the operating conditions in accordance with SOA the desired or necessary function of the semiconductor module can no longer reliably be provided, for example because the semiconductor module is no longer operational or the like because of a failure of the semiconductor element.

It is preferably proposed that the electrical load of the semiconductor module and the cooling during normal operation are sensed and the comparison is carried out as soon as the predefined electrical load is determined during the predefined cooling. This means it is possible to determine the prediction data even during normal operation of the semiconductor module. In this case this development is based on the idea that the predefined load and the predefined cooling may repeatedly occur in normal operation at particular times, which can also be predetermined. This means a separate test signal for the normal load and the normal cooling does not need to be provided to determine the prediction data for this case. Furthermore, in this development normal operation can be continued overall without disruption.

According to one development it is proposed that the cooling is predetermined by the cooling device and the electrical load externally to normal operation. This means the prediction data can be determined at a predefinable time. This can for example be prior to normal operation being carried out or else during an interruption in operation or a break in operation. This embodiment is particularly suitable if during the normal operation of the semiconductor module the predefined electrical load and/or the predefined electrical cooling are not achieved, or are only very rarely achieved.

It is further proposed that the temperature and/or the determined thermal resistance sensed in respect of the predefined load during the predefined cooling is stored. This means it is possible to document the aging of the semiconductor module and at the same time to determine the comparison temperature or the thermal reference resistance more accurately by additional evaluation, such that overall the determination of the prediction data can be further improved. In addition, it is also as a result possible to intervene for example in the cooling device and to strengthen a cooling function such that on the basis of aging effects an increased temperature of the semiconductor element can be reduced. This means the normal use of the semiconductor module can be increased overall. Preferably the comparison temperature and/or the thermal reference resistance are to be correspondingly adjusted in this case.

The prediction data is preferably determined before the end of usability for normal usability of the semiconductor module is reached. This means that thanks to the prediction data a predicted still available usability of the semiconductor module can be displayed by means of a corresponding message. The user can thus, preferably continuously, be informed about the remaining normal usability, such that if necessary specific usage scenarios that require reliable functioning of the semiconductor module can be correspondingly planned. The prediction data is therefore not only determined at the end of usability.

It is further proposed that in the event of a difference between the sensed temperature and the comparison temperature and/or a difference between the determined thermal resistance and the thermal reference resistance, which is greater than a predefined reference value, the end of usability is displayed. This means that a potentially dangerous failure of the semiconductor module can be fixed beforehand by means of maintenance. For example, the semiconductor module can be replaced for this purpose. This can be an advantage, particularly in the case of safety-related uses of the semiconductor module. The reference value can for example have been determined empirically by laboratory trials or the like. In addition, the reference value can also have been determined by taking statistical evaluation methods into consideration.

According to one development it is proposed that as a function of the difference between the sensed temperature and the comparison temperature and/or the difference between the determined thermal resistance and the thermal reference resistance a load signal for setting a maximum load of the semiconductor module is output. This means that for example a load derating by the control unit can be implemented, as a result of which the usability of the device that comprises the semiconductor module can be increased. The end of usability can thus be delayed. In addition it is also possible for emergency operation to be maintained until maintenance can be carried out, in order for example to replace the semiconductor module. The reliability can be improved overall as a result.

If a semiconductor module in an energy converter serves to electrically couple an electric machine to a d.c. link, it can additionally be provided that the electric machine is controlled in accordance with vector control and an exclusively field-forming current is set in respect of the electric machine as a predefinable electric load. This means it is possible for a high thermal load of the semiconductor element to be achieved in a short time. The sensed temperature and/or the determined thermal resistance can then be used to determine the prediction data, as already explained above. The prediction data can therefore be determined in this case in an existing device or application without additional interventions to this effect being necessary. It proves to be particularly advantageous that thanks to the field-forming current the electric machine does not need to generate any torque, such that this does not result in any undesired effects by the electric machine.

The field-forming current is preferably set externally to normal operation of the electric machine. This means it is possible to set the conditions, the predefined electrical load and the predefined cooling virtually at will, because operation of the electric machine does not need to be taken into consideration. The use of the inventive method can thereby be improved.

BRIEF DESCRIPTION OF THE DRAWING

Further features, advantages and effects emerge from the following exemplary embodiment on the basis of the figures. In the figures the same reference characters designate the same features and functions, wherein:

FIG. 1 shows a schematic circuit diagram of a drive device 10 having a power inverter 14 as an energy converter, which comprises three terminal contacts 46 for connecting a three-phase asynchronous machine 12. The asynchronous machine 12 comprises the phases U, V, W. The power inverter 14 further comprises terminal contacts 48, via which it is connected to a d.c. link 16 which has an intermediate circuit capacitor, or energy store, 18. The terminal contacts 48 form a d.c. link terminal.

Figure 1:
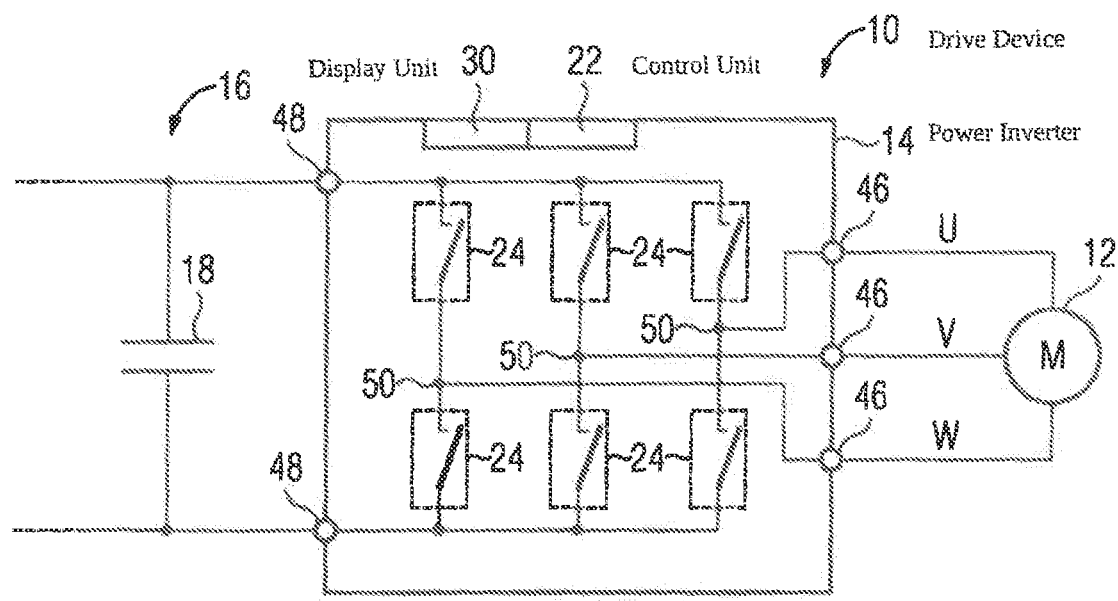
FIG. 1 shows a schematic circuit diagram of a drive device with an asynchronous motor connected to a power inverter.

The power inverter 14 has IGBT modules 24 as semiconductor modules or switching elements, which in a known manner are connected in pairs in series circuits, the central terminals 50 of which are connected to the corresponding terminal contacts 46.

The power inverter 14 further comprises a control unit 22 which provides switching signals for the IGBT modules 24, so that this is operated in switching mode. This means the asynchronous machine 12 can be coupled to the d.c. link 16 in a predefinable manner.

Also connected to the control unit 22 is a display unit 30, via which operating parameters and current operating data of the drive device 10, in particular of the power inverter 14, can be displayed.

Figure 2:
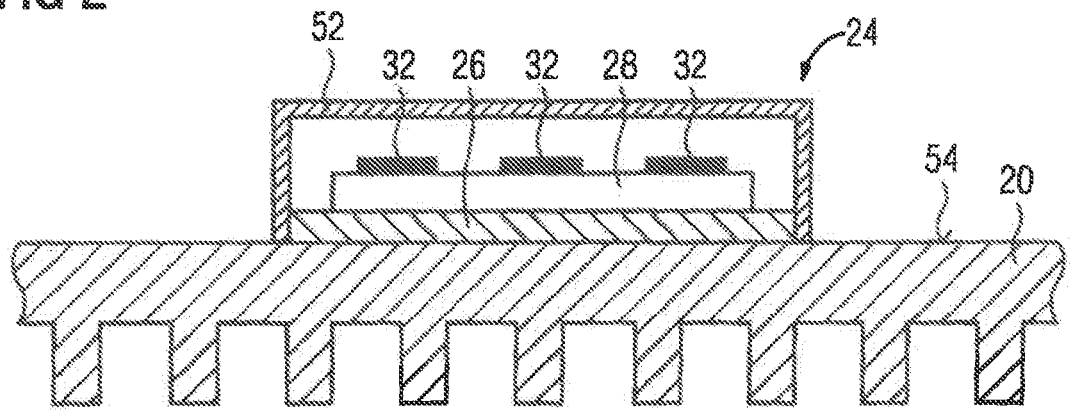
FIG. 2 shows a schematic sectional representation of an IBGT module arranged on a heat sink in a schematic sectional view.

FIG. 2 shows a schematic mechanical structure of one of the IGBT modules 24, as is used in the power inverter 14 in accordance with FIG. 1. The representation in FIG. 2 is a sectional representation. It can be seen that the IGBT module 24 has a housing 52 which comprises a mounting plate 26. The mounting plate 26 is in this case connected to a connection surface 54 of a heat sink 20, which provides a cooling device. A predefined cooling is achieved by the heat sink 20.

To achieve as good heat dissipation as possible in respect of the IGBT module 24, the mounting plate 26 and the connection surface 54 are embodied as adapted to one another. This means a particularly favorable or small thermal transfer resistance can be achieved. The mounting plate 26 thus provides a cooling surface.

A semiconductor element 28 is attached to the inside of the housing on the mounting plate 26 above a layer structure not shown in greater detail. The layer structure serves for the thermal and mechanical connection of the semiconductor element 28 to the mounting plate 26.

The semiconductor element 28 provides the actual IGBT. A predefined thermal transfer resistance is provided in respect of the semiconductor element 28 and the mounting plate 26.

It can further be seen that the semiconductor element 28 has, opposite the mounting plate 26, contact surfaces 32 which by means of a known bonding are connected to corresponding connection contacts (not shown) of the IGBT module 24. In this way a mechanical connection and a corresponding electrical connection can be achieved.

Figure 3:
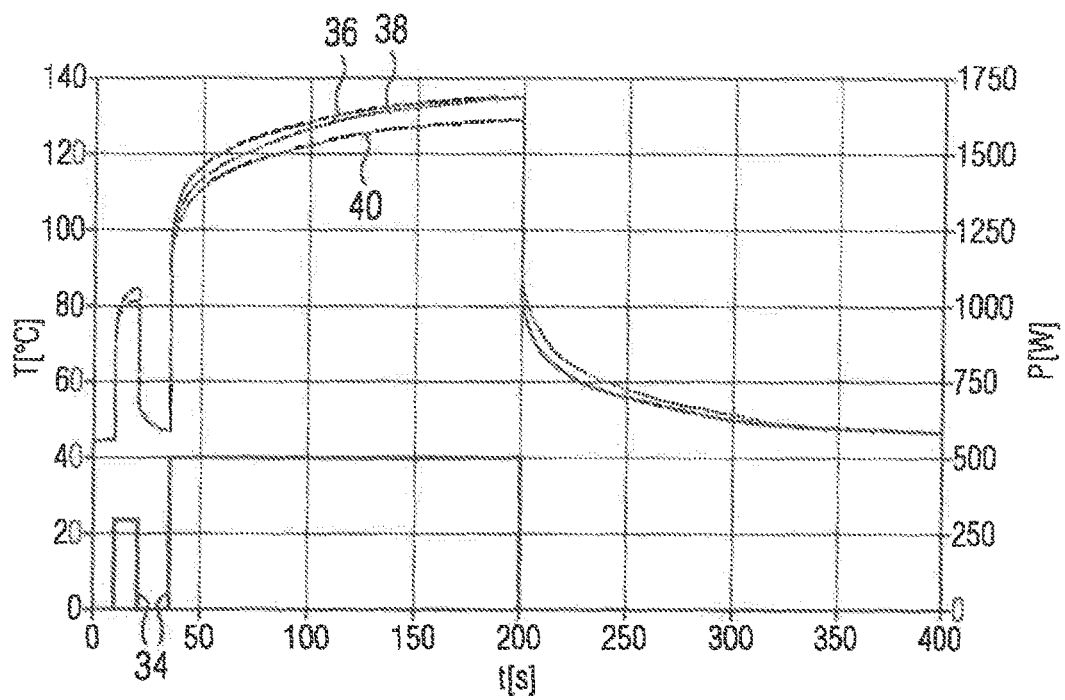
FIG. 3 shows a schematic diagrammatic representation for a predefined electrical load of the IGBT module in accordance with FIG. 2 and of corresponding temperatures.

In order now to be able to determine the remaining usability of the IGBT module 24 in normal use, both the cooling by the heat sink 20 and the electrical load of the IGBT modules 24 are monitored. If a predefined electrical load in accordance with the graph 34 (FIG. 3) is determined, at the same time the corresponding temperatures of the semiconductor elements 28 of the semiconductor modules 24 are sensed in accordance with graph 36 (FIG. 3). A comparison temperature in accordance with the graph 40 was previously already determined for the predefined electrical load in accordance with the graph 34.

In a comparison carried out by the control unit 22, the sensed temperature in accordance with the graph 36 is compared to the comparison temperature in accordance with the graph 40. As a function of the comparison, prediction data (FIG. 4) is then determined, which is processed by the display unit 30, such that the display unit 30 indicates the remaining usability as a remaining usability period.

In the present case for the IGBT modules 24 the temperature is determined by measuring the threshold voltage of the IGBT modules 24. As is known, this voltage is a function of the temperature of the respective semiconductor chips, such that the actual temperatures of the semiconductor elements 28 can be determined from the determined values of said voltage. In the present case the prediction data 44 (FIG. 4) is thus a function of a difference between the sensed temperature in accordance with the graph 36 and the comparison temperature in accordance with the graph 40. The comparison temperature can be determined using models, statistical evaluation methods and laboratory trials.

It can further be seen in FIG. 3 how the sensed temperature behaves if the cooling by the cooling device, here the heat sink 20, is disrupted, because for example an air filter is clogged or the like. This is illustrated on the basis of the graph 38. It can be seen that in this case a rate of increase is smaller than represented with the graph 36. This means the control unit 22 can recognize whether cooling by the heat sink 20 is still sufficient or has even been disrupted. The control unit 22 can thus distinguish this from the prediction data 44 attributable to aging.

FIG. 3 shows a schematic diagrammatic representation in which the abscissa is assigned to the time in seconds. A left-hand ordinate is assigned to the temperature in degrees Celsius and a right-hand ordinate to the power in watts. A graph 34 represents the predefined electrical load of a respective one of the IGBT modules 24. It can be seen that the predefined electrical load primarily comprises two square-wave pulses, wherein the chronologically first square-wave pulse is a comparatively chronologically short-duration square-wave pulse with a power of approximately 300 watts. This is followed after a brief power break by a second square-wave pulse which extends over a period of approximately 160 s and provides a power of approximately 500 W. This predefined electrical load results in a temperature of the semiconductor element 28 of the IGBT module 24 in accordance with the graph 36.

The corresponding comparison temperature for such a load for an IGBT module 24 which is in mint condition emerges on the basis of the graph 40. It can be seen that as aging increases the interval between the graphs 36 and 40 becomes larger. If a predefined maximum interval between the graphs 36 and 40 is achieved or exceeded, this is determined as an end of usability. The remaining normal usability can thus be inferred or predicted from the difference or the interval between the graphs 36 and 40. For this purpose the control unit 22 comprises an evaluation unit (not shown in greater detail), which uses statistical methods to determine the remaining normal usability and provides a corresponding message as a signal for the display unit 30. This evaluates the signal provided and provides a corresponding output of information for a user.

Figure 4:
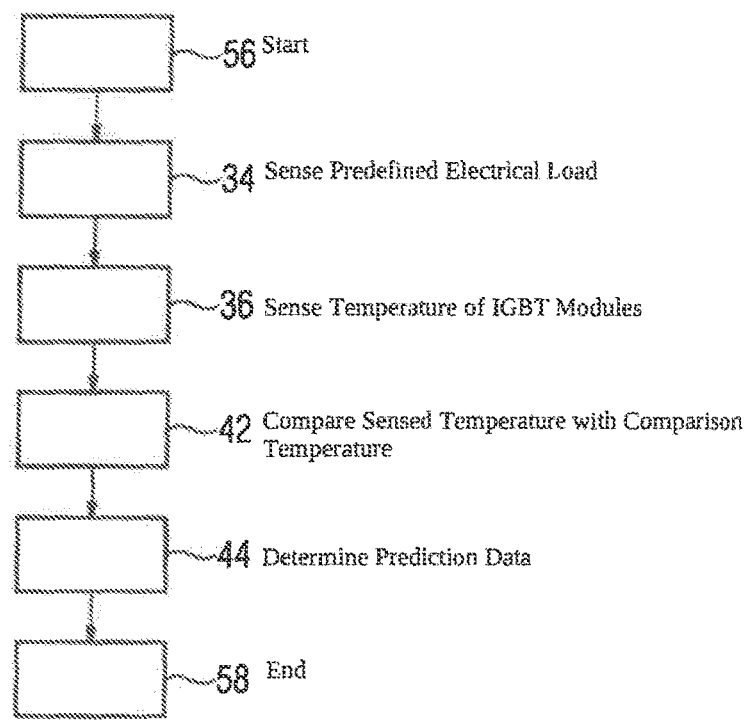
FIG. 4 shows a schematic flowchart for an inventive procedure.

FIG. 4 shows a schematic flowchart for the process of the inventive method. The method starts at step 56. A predefined electrical load is sensed in the corresponding step 34. In step 36 the temperature of the IGBT modules 24 is then sensed at the same time. The sensed temperature is then compared in a comparison step 42 with the comparison temperature 40. In the following step 44 the prediction data is then determined as a function of the comparison. The method ends in step 58.

With the invention a system operator of the drive device 10 can be more reliably warned that a power semiconductor, here of one of the IGBT modules 24, may fail in the near future. Thus corresponding maintenance can be planned in good time, such that extensive damage and lengthy downtimes of the power inverter 14 can be avoided. Because the failure of one of the IGBT modules 24 can be identified in good time, more extensive further damage to the drive device 10, in particular at the power inverter 14, can be largely avoided.

The present exemplary embodiment serves solely to explain the invention and should not limit said invention.

What is claimed is:

1. A method for determining a remaining usability of at least one semiconductor module in normal use comprising:
connecting an energy converter to an electric machine;
electrically coupling the electric machine to a d.c. link with the energy converter;
thermally coupling the at least one semiconductor module to a cooling device;
electrically coupling at least one energy store to the at least one semiconductor module;
switching the at least one semiconductor module in a predefinable switching mode to electrically couple the d.c. link to the electric machine;
controlling the electric machine in accordance with vector control and setting an exclusively field-forming current in respect of the electric machine as a predefinable electrical load;
applying a predefined electrical load comprising predefined switching patterns with a predetermined voltage stress and/or current stress to the at least one semiconductor module in normal operation while effecting a predefined cooling by the cooling device;
sensing an electrical load of the at least one semiconductor module and cooling during normal operation;
sensing a temperature of a semiconductor element of the at least one semiconductor module at least for the predefined electrical load of the at least one semiconductor module;
comparing as soon as the predefined electrical load during the predefined cooling is determined, the sensed temperature with a comparison temperature assigned to the predefined electrical load while the predefined cooling is effected in a first comparison; and
determining prediction data for the remaining usability of the at least one semiconductor module as a function of the first comparison.

2. The method as claimed in claim 1, further comprising:
determining a thermal resistance between the at least one semiconductor element and the cooling device;
comparing the determined thermal resistance with a thermal reference resistance in a second comparison; and
additionally determining the prediction data as a function of the second comparison.

3. The method of claim 1 further comprising:
storing the temperature sensed in respect of the predefined load during the predefined cooling.

4. The method of claim 3 further comprising:
documenting due to the storage an aging of the semiconductor module and increasing a cooling function based on aging effects.

5. The method of claim 1 further comprising:
determining the prediction data before an end of usability for the usability of the semiconductor module in normal use is reached.

6. The method of claim 1 further comprising:
displaying the end of usability in an event of a difference between the sensed temperature and the comparison temperature is greater than a predefined reference value.

7. The method of claim 1 further comprising:
outputting a load signal to set a maximum load of the at least one semiconductor module as a function of a difference between the sensed temperature and the comparison temperature.

8. The method of claim 1 further comprising:
externally setting the field-forming current to normal operation of the electric machine.

9. A control unit for controlling at least one semiconductor module thermally coupled to a cooling device, wherein the control unit is configured to carry out the method of claim 1.

10. An energy converter for connection to an electric machine, said energy converter comprising:
at least one semiconductor module;
at least one cooling device thermally coupled to the at least one semiconductor module;
at least one energy store electrically coupled to the at least one semiconductor module;
connection contacts for connection of the electric machine;
a d.c. link terminal for connecting the energy converter to a d.c. link; and
a control unit of claim 9 electrically coupled to the at least one semiconductor module for controlling the at least one semiconductor module in a predefinable switching mode, in order to electrically couple the d.c. link and the electric machine to one another.

11. A method for determining a remaining usability of at least one semiconductor module in normal use comprising:
connecting an energy converter to an electric machine;
electrically coupling the electric machine to a d.c. link with the energy converter;
thermally coupling the at least one semiconductor module to a cooling device;
electrically coupling at least one energy store to the at least one semiconductor module;
switching the at least one semiconductor module in a predefinable switching mode to electrically couple the d.c. link to the electric machine;
controlling the electric machine in accordance with vector control and setting an exclusively field-forming current in respect of the electric machine as a predefinable electrical load;
applying a predefined electrical load comprising predefined switching patterns with a predetermined voltage stress and/or current stress to the at least one semiconductor module in normal operation while effecting a predefined cooling by the cooling device;
sensing an electrical load of the at least one semiconductor module and cooling during normal operation;
determinng a thermal resistance between a semiconductor element of the at least one semiconductor module and the cooling device;
comparing as soon as the predefined electrical load during the predefined cooling is determined, the determined thermal resistance with a thermal reference resistance in a second comparison; and
determining prediction data for the remaining usability of the at least one semiconductor module as a function of the second comparison.

12. The method of claim 11 further comprising:
storing the determined thermal resistance.

13. The method of claim 12 further comprising:
documenting due to the storage an aging of the semiconductor module and increasing a cooling function based on aging effects.

14. The method of claim 11 further comprising:
determining the prediction data before an end of usability for the usability of the semiconductor module in normal use is reached.

15. The method of claim 11 further comprising:
displaying the end of usability in an event of a difference between a difference between the determined thermal resistance and the thermal reference resistance is greater than a predefined reference value.

16. The method of claim 11 further comprising:
outputting a load signal to set a maximum load of the at least one semiconductor module as a function of a difference between the determined thermal resistance and the thermal reference resistance.

17. The method of claim 11 further comprising:
externally setting the field-forming current to normal operation of the electric machine.

18. A control unit for controlling at least one semiconductor module thermally coupled to a coding device, wherein the control unit is configured to carry out the method of claim 11.

19. An energy converter for connection to an electric machine, said energy converter comprising:
   at least one semiconductor module;
   at least one cooling device thermally coupled to the at least one semiconductor module;
   at least one energy store electrically coupled to the at least one semiconductor module;
   connection contacts for connection of the electric machine;
   a d.c. link terminal for connecting the energy converter to a d.c. link; and
   a control unit of claim 18 electrically coupled to the at least one semiconductor module for controlling the at least one semiconductor module in a predefinable switching mode, in order to electrically couple the d.c. link and the electric machine to one another.

20. A method for determining a remaining usability of at least one semiconductor module in normal use comprising:
   connecting an energy converter to an electric machine;
   electrically coupling the electric machine to a d.c. link with the energy converter;
   thermally coupling the at least one semiconductor module to a cooling device;
   electrically coupling at least one energy store to the at least one semiconductor module;
   switching the at least one semiconductor module in a predefinable switching mode to electrically couple the d.c. link to the electric machine;
   controlling the electric machine in accordance with vector control end setting an exclusively field-forming current in respect of the electric machine as a predefinable electrical load;
   applying a predefined electrical load comprising predefined switching patterns with a predetermined voltage stress and/or current stress to the at least one semiconductor module in normal operation while effecting a predefined cooling by the cooling device;
   sensing an electrical load of the at least one semiconductor module and cooling during normal operation;
   sensing or determining an operating condition of a semiconductor element of the at least one semiconductor module;
   comparing as soon as the predefined electrical load during the predefined cooling is determined, the sensed or determined operating condition with a comparison operating condition in a comparison; and
   determining prediction data for the remaining usability of the at least one semiconductor module as a function of the comparison.

* * * * *